United States Patent [19]
Kennedy

[11] Patent Number: 5,734,340
[45] Date of Patent: Mar. 31, 1998

[54] METHOD AND APPARATUS FOR STORING RUN-INTENSIVE INFORMATION IN COMPACT FORM

[75] Inventor: Mark Kevin Kennedy, Redondo Beach, Calif.

[73] Assignee: Symantech Corporation, Cupertino, Calif.

[21] Appl. No.: 703,534

[22] Filed: Aug. 27, 1996

[51] Int. Cl.$^6$ .................................................. H03M 7/46
[52] U.S. Cl. .................................................. 341/59; 395/612
[58] Field of Search .................. 341/50, 59; 395/600, 395/612

[56] References Cited

U.S. PATENT DOCUMENTS

| | | | |
|---|---|---|---|
| 4,560,976 | 12/1985 | Finn | 340/347 |
| 4,586,027 | 4/1986 | Tsukiyama et al. | 340/347 |
| 4,872,009 | 10/1989 | Tsukiyama et al. | 341/95 |
| 4,988,998 | 1/1991 | O'Brien | 341/55 |
| 4,992,954 | 2/1991 | Takeda et al. | 364/518 |
| 5,051,745 | 9/1991 | Katz | 341/51 |
| 5,163,148 | 11/1992 | Walls | 395/600 |
| 5,548,751 | 8/1996 | Ryu et al. | 395/600 |

*Primary Examiner*—Jeffrey A. Gaffin
*Assistant Examiner*—Peguy JeanPierre
*Attorney, Agent, or Firm*—Fliesler Dubb Meyer & Lovejoy LLP

[57] ABSTRACT

A method for compressing FAT and FAT-like structures, which include runs of primitives and runs intervening codes, includes the steps of receiving a plurality of primitive runs in a memory and generating a plurality of variable-length code sequences where each code sequence is dedicated to a primitive run. Each code sequence indicates of its dedicated run, a primitive-type, a primitive runlength, the presence of an intervening run and, if present, an intervening runlength, and the presence of a jump value pointer. If a jump value pointer is present, the code sequence further indicates the jumplength, which is indicated as a difference (or α) value. The length of each code sequence varies depending on run characteristics such as primitive runlength, intervening runlengths and jumplength.

30 Claims, 7 Drawing Sheets

METHOD AND APPARATUS FOR STORING RUN-INTENSIVE INFORMATION IN COMPACT FORM

BACKGROUND OF THE INVENTION

1. Field of Invention

The invention generally relates to computer-automated data compression, and particularly to compression of run-intensive data structures such as file allocation tables (FATs).

2. Description of Related Art

In computer systems, files (for both data and executable applications) are generally stored in a nonvolatile form of storage such as a magnetic or optical disk.

Disks are usually divided into sectors, a number of which (usually 2–16) are treated as a single unit known as a cluster. For example, there may be four sectors in a cluster. For operating systems (OS's) a cluster is often considered a minimum increment of file storage. Therefore, for instance, if a file having 30 bytes of data is to be stored on a disk and the disk is organized as clusters each consisting of four 512-byte sectors, that file will consume 2,048 bytes of disk space even though it only contains 30 bytes of data. While this may seem wasteful, it generally is not excessively inefficient because most files have at least 2K bytes of data, if not much more.

In order to keep track of where data is stored on a disk, the OS, particularly MS-DOS™, will typically use two data structures: a directory list and a file allocation table (FAT). The FAT contains an entry for every cluster on the disk indicating whether that cluster is good or bad. The directory list identifies each file by name, location, and other attributes (e.g., date of last update, etc.). Often, the directory entry of each file includes a pointer that points to the first FAT entry that represents the cluster where the file starts. If the file is larger than one cluster, the starting cluster entry in the FAT contains a next-cluster value which points to the next-used cluster for that file. The next-used cluster entry in the FAT contains a pointer to yet another cluster, and so on, until the end of the file is reached. The cluster entry for the end of file in the FAT contains an end of file (EOF) code. If a cluster contains no file information, that cluster entry in the FAT contains a null-indicator such as zero (0). If a cluster becomes damaged, its FAT entry is marked with a damaged-indicating code and the cluster is not used again.

Both the directory list and the FAT are generally needed for accessing disk contents in an intelligible manner. Without the FAT, for instance, accessing data would be next to impossible because although the data may be present on the disk, the location of the data on the disk is lost.

Until recently, FATs generally were two types: 12-bit FATs and 16-bit FATs. A 12-bit FAT uses three bytes to define every two entries in the FAT. The 12-bit FAT is typically used for floppy disks and small hard drives. A 16-bit FAT uses two bytes to define each cluster entry. Typically, a 16-bit FAT has no more than 64K entries, and thus its maximum size is 128K bytes.

Generally both 12-bit and 16-bit types of FATs are easily backed up on a disk without having to compress their mirror copies. If something were to corrupt or delete the primary FAT on the computer system the mirror FAT can be used to reconstruct the primary FAT. One computer program which saves a mirror copy of the FAT as part of its function is IMAGE™, part of a Norton Utilities package from Symantec of California.

Recently, however, with the advent of Windows'95™ (trademark of Microsoft Corp. of Redmond, Wash.), came the introduction of the 32-bit FAT. Each cluster entry in a 32-bit FAT is defined by four bytes. There can be as many as 268,435,455 entries in a 32-bit FAT, causing the FAT to be as large as over 1 Gigabyte. 1 Gig is generally considered an unacceptable amount of space to use for storing a FAT mirror copy for backup purposes. Thus, there now is a need to compress the FAT backup copy prior to storage.

Several general-purpose compression programs are available that may be useful for compressing a backup copy of a FAT. These include, for instance, PKZIP™, produced by PKWare of Wisconsin. These compression programs, however, are geared toward compressing all types of data, not just FAT data. Thus, while a program such as PKZIP™ will indeed compress a FAT, it will do so only at a ratio of approximately 11:1. Using a program like PKZIP™, a typical 1 Gig FAT would be compressed to approximately 98 Mbyte. The result is still considered much too large for backup FAT storage purposes. A special-purpose compression algorithm that is dedicated to compressing 32-bit FAT structures and the like may provide a better result.

SUMMARY OF THE INVENTION

The invention provides a method and system for compressing a FAT or other run-intensive data structure, where that structure generally comprises runs of data and often includes runs of zeros, runs of ones, and/or runs of other-repeated code primitives A method in accordance with the invention comprises the steps of: (1) receiving a plurality of primitive runs, where a primitive is an identified code; and (2) generating a plurality of code sequences, where each code sequence varies in length with respect to the length of other code sequences in said plurality of code sequences. Each code sequence includes a header portion and a stream portion. The header portion has a length equal in length to the header portion of each code sequence in said plurality of code sequences. The stream portion has a length which varies in length with respect to the length of the stream portion of other code sequences in said plurality of code sequences and said stream portion has a length ≥0. Each code sequence is dedicated to a primitive run, and each code sequence indicates of its dedicated primitive run, a primitive type and a primitive runlength. In some embodiments of the invention, code sequences also indicate for their dedicated run a jumplength for a jump value pointer. In other embodiments of the invention, each code sequence further indicates an intervening runlength, for runs of non-primitive values.

A system in accordance with the invention includes an input means for storing a plurality of primitive and intervening runs; an output means for storing a plurality of code sequences; and code sequence generating means, operatively coupled to said input means and said output means, for generating said plurality of code sequences, where each code sequence has a header portion and a stream portion. The header portion has a length equal to the length of the header of each code sequence in the plurality of code sequences and the stream portion has a length which varies in length with respect to the length of the stream portion of other code sequences in the plurality of code sequences. Each code sequence is dedicated to a primitive run and indicates of its dedicated run a primitive-type, a primitive runlength, an intervening runlength, and a jumplength for a jump value pointer. In one embodiment of the invention, the code sequence generating means includes a processing unit and program instructions stored on a memory, and the input means and output means are also included in the memory.

BRIEF DESCRIPTION OF THE DRAWINGS

The below detailed description makes reference to the accompanying drawings, in which.

DETAILED DESCRIPTION

The structure of a FATs especially in a MS-DOS™ or Windows'95™ (both trademarks of Microsoft, Inc.) operating system, can be better appreciated by considering the example FAT 180 given in FIG. 1 (which is described in more detail below). The FAT is basically a table with two rows: one describing every cluster number for the disk and a second describing a value for each cluster.

Before the clusters on a disk are allocated to various files, the FAT carries a null value (e.g., 0) for each usable (good) cluster. Thus, the FAT for an empty good disk contains mostly all null values. As files are added to the disk, the FAT values change. If a file only uses one cluster of space, the entry for that one cluster will be an EOF in the FAT. In FAT 180 of FIG. 1, the file located at cluster 11 uses only 1 cluster of space.

If a file uses more than one cluster of space, the first cluster entry in the FAT for that file contains a next-cluster value which points to a second cluster used for the same file. The second cluster entry in turn contains a next-cluster value which points to another cluster, and so on, until the end of the file is reached. The last cluster of the file receives an EOF value in its FAT entry. In FAT 180 of FIG. 1, for example, the file that starts at cluster 13 points to cluster 14, cluster 14 points to cluster 15, and so on until the end of the file is reached at cluster 27, which has an EOF value. The values thus form a linked list for each file, indicating every cluster in which a file is located.

Typically, disk clusters are allocated in sequential order, so that if, for example, a file starts at cluster 13, the next-cluster pointer for cluster 13's FAT entry points to cluster 14. Occasionally, the next sequential cluster is not available for use by a file, e.g., if that cluster is damaged or has been allocated to another file. In such a case, a "jump value" pointer other than +1 is used. That is, a pointer value other than +1 is used to point to the next cluster in which the file continues. In FAT 180, the file that starts at cluster 50 continues in clusters 51–71, but then jumps from cluster 71 to cluster 103 and continues. A file with many jumps is often referred to as a "fragmented file.".

Figure 1:
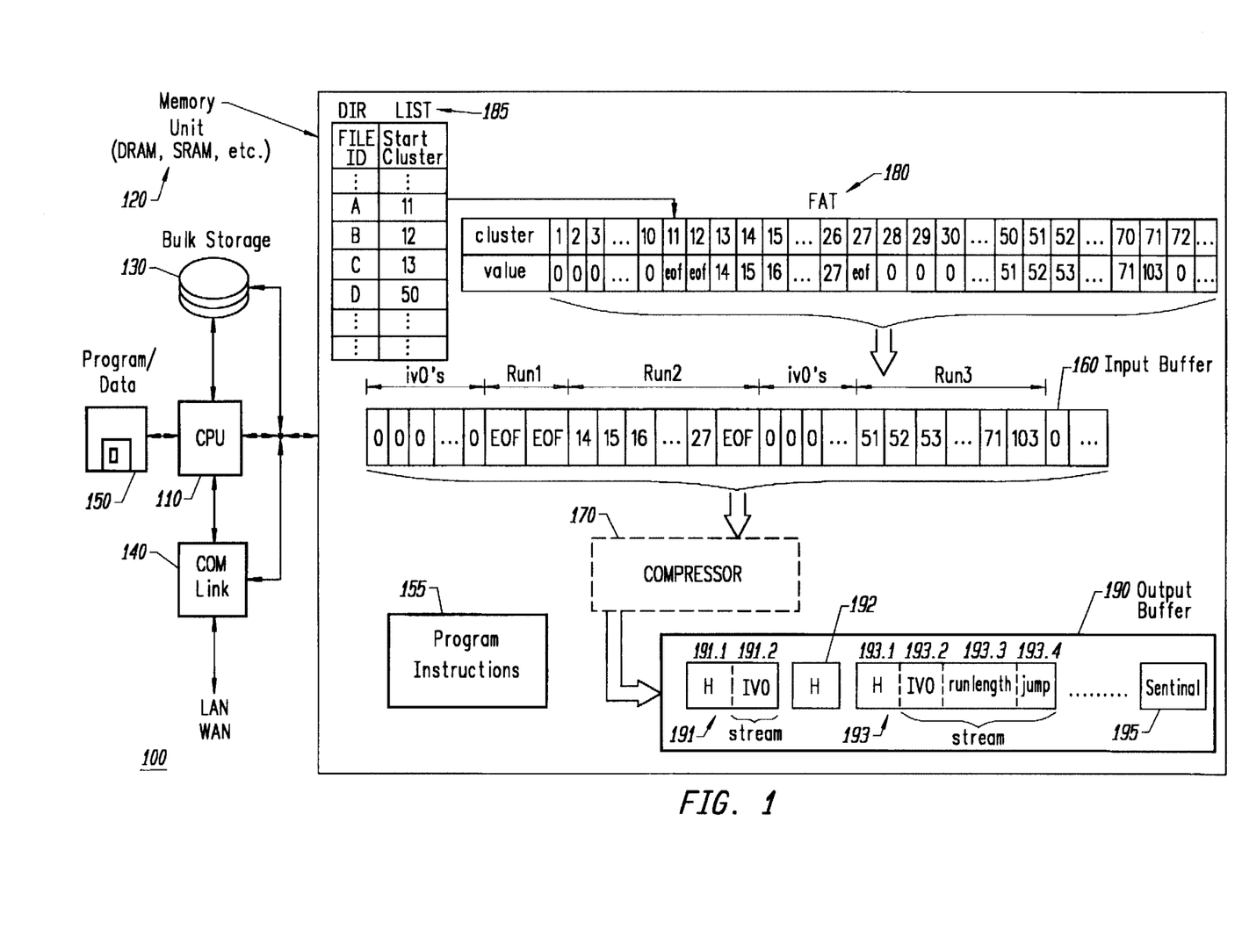
FIG. 1 is a block diagram of a computer system in accordance with the invention.

Also shown in FIG. 1 is an example directory list 185. Directory list 185 contains a "file ID" for each file on the disk, where several file ID's are represented in FIG. 1 with the letters "A", "B", "C", and "D". Directory List 185 also contains for each file a start cluster pointer, which points to the cluster entry in the FAT 180 for the first cluster in the file. For example, in directory list 185, file "A" starts at cluster 11.

As can be seen with reference to FAT 180 in FIG. 1, a FAT is typically composed of three types of runs: (1) runs of zeros; (2) runs of EOFs (e.g., when there are many small files on a disk); and (3) runs of consecutive increasing integers, or +1 jumps. Runs are generally a consecutive repeat of a code N times (N≧1). Further, in a FAT, runs of consecutive increasing integers generally terminate with either an EOF code or with a jump value pointer. As used herein with reference to FATs, a "jump value" refers to jumps that are not +1 jumps. In addition, a disk with damaged clusters may also have runs of damaged-indicating codes since damaged clusters tend to come in concentrated bursts on a physical disk, generally because the event that damaged the disk is usually localized.

The present invention takes advantage of this unique structure of the FAT to achieve a higher rate of compression than general-purpose compressors. A method and apparatus in accordance with the invention are described with reference to FIGS. 1–6.

FIG. 1 is a block diagram of a computer system 100 in accordance with the invention. Computer system 100 includes a local or central processing unit (CPU) 110 Operatively coupled to a high-speed memory unit 120 (e.g., a unit comprised of dynamic random access memory devices (DRAMs) and/or static random access memory devices (SRAMs)). CPU 110 responds to instructions stored within the memory unit 120 and/or modifies data within the memory unit 120 in accordance with instructions provided to the CPU 110. The instructions are conveyed to CPU 110 as electrical, optical or other signals.

System 100 further includes a bulk storage unit 130 (e.g., a magnetic disk bank) which is operatively coupled to the CPU 110 and/or memory unit 120 for transferring data between the slower bulk storage unit 130 and the memory unit 120 as needed.

System 100 also includes a communications link 140, operatively coupled to the CPU 110 and/or the memory unit 120, for exchanging data between system 100 and other systems (not shown) over a local area network (LAN) or a wide area network (WAN) or other communications media.

A program/data loading means 150 such as a floppy disk drive or a tape drive or a ROM cartridge reader is provided to load program instructions 155 and/or other data from a removably-insertible transfer media such as a magnetically-encoded floppy disk or an optically-encoded disk (e.g., CD-ROM) or a magnetic tape or a ROM (ready-only memory) cartridge into system 100 for storage within one or both of the fast-memory unit 120 and the bulk-storage unit 130. Alternatively, the program instructions 155 and/or other data may be down-loaded into system 100 by way of the communications link 140. The program instructions 155 are used for controlling operations of the CPU 110.

A pre-loaded set of program instructions are represented as occupying a first region 155 of the memory space within memory unit 120.

Another region of the memory 120, input buffer 160, holds part or all of a source data file (e.g., the values from FAT 180) that is to a compreressed to form a compressed output file that will be stored in yet another region of memory, referred to as the output buffer 190. After compression completes, the data in output buffer 190 is transferred out of memory unit 120 for storage in the bulk storage unit 130 and/or for storage in a removable media (e.g., floppy disk) within the program/data loading means 150 and/or for transmittal over a communications network by way of link 140.

Although FAT 180 and directory list 185 are shown in FIG. 1 as occupying regions of memory unit 120, it is to be understood that FAT 180 and directory list 185 may occupy space in memory 120, in bulk storage unit 130, or elsewhere (e.g., a floppy disk), and than they are shown as occupying space in fast storage unit 120 for illustrative purposes only.

Figure 2:
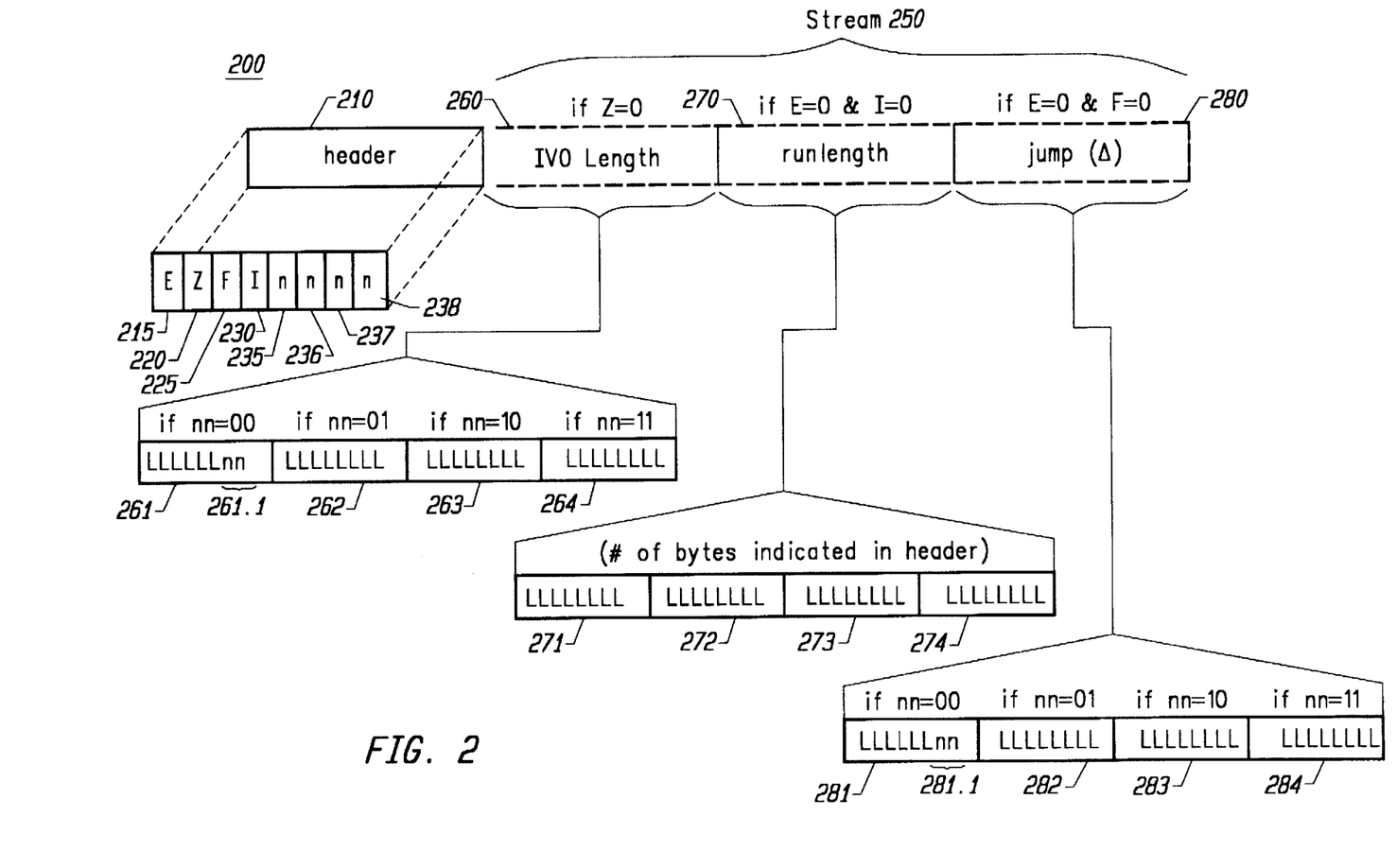
FIG. 2 is a block diagram representing the general compressed data structure in accordance with the invention.

Once the data in input buffer 160 is compressed, and before being transferred out of memory unit 120, the compressed data is stored in output buffer 190. The general form of compressed data is shown in FIG. 2. For each run of primitives in the FAT or other run-intensive structure, a code sequence 200 is formed. As used herein, a "primitive" is a code which may consist of one or more binary digits or other types of values (e.g., characters). A primitive is best defined and/or identified prior to actual compression of a run-intensive structure, i.e., forming code sequences 200. However, such identification can be as broad as identifying any two-bit (or four-bit, etc.) pattern or as specific as identifying a particular pattern (e.g., 1101 EOF, etc.). An "intervening run" is a run of codes which are not identified or defined as primitives and which intrude between primitive runs. Intervening runs do not receive a dedicated code sequence 200, but rather their presence and/or length is embedded into a code sequence 200 dedicated to a primitive run. Intervening codes can be specifically identified and/or defined prior to compression, or intervening codes can be identified by default as any code that is not a primitive.

Code sequence 200 contains a fixed-length header 210 and variable-length stream 250. The header 210 is referred to as "fixed-length" because every code sequence 200 will have a header 210 of identical length. The stream 250 is referred to as "variable-length" because the length of stream 250 will vary from code sequence to code sequence, depending on the characteristics of the run compressed.

Fixed-length header 210, in one embodiment of the invention, is comprised of eight bits of data (1 byte) and indicates whether the type of primitive run that code sequence 200 is describing is a run of EOFs or a run of +1 jumps. If the run is a run of integers (or +1 jumps), the header byte also indicates how the run is terminated, e.g., with an EOF or with a jump value.

Further, in one embodiment, header byte 210 indicates whether there was an intervening run of zeros between the current primitive run being encoded and the last previous primitive run encoded. These runs of zeros are often referred to herein as intervening zeros (or "iv 0's"). In other embodiments of the invention, header 210 may indicate intervening runs of zeros (or other code) which follow the current run. Zeros are not defined as primitives in the current embodiment, and thus do not receive a run code sequence 200 because a FAT starts with the majority of its entries as zeros. Thus, compression is generally more efficient when the length of intervening zero runs are embedded in a compressed code sequence of a non-zero primitive run. Other embodiments of the invention may embed in a code sequence intervening code runs which are formed of codes of other than zeros. Further, in still other embodiments of the invention, zeros may be identified as primitives while other codes are identified as intervening codes.

Table 1 below summarizes the bits used in header 210 in one embodiment of the invention. Other embodiments of the invention may reverse various "1" and "0" indications, and may further utilize a differing number of bits in fixed-length header to indicate similar information.

TABLE 1

| E | 1 if run of EOFs |
| | 0 if run of integers (+1 jumps) |
| Z | 1 if no intervening run of zeros |
| | 0 if run of intervening zeros |
| F | 1 if run ends in EOF (and E=0) |
| | 0 if run ends in jump value (and E=0) |
| I | 1 if runlength is included in the stream |
| | 0 if runlength is included in the header |
| nnnn | if I=1, then nnnn = xx00 for 1 byte in runlength descriptor |
| | = xx01 for 2 bytes in runlength descriptor |
| | = xx10 for 3 bytes in runlength descriptor |
| | = xx11 for 4 bytes in runlength descriptor |
| | If I=0, then nnnn indicates the runlength |

Header 210 uses its highest order bit E 215 to indicate whether the type of primitive run being encoded is a run of EOFs or a run of +1 jumps. Bit Z 220 is used to indicate the presence of an intervening run of zeros between the current primitive run being encoded and the last previously encoded primitive run. Bit F 225 is used to indicate; whether a run of integers (+1 jumps) is terminated with an EOF or with a jump value that is not +1.

Bit I 230, is used to indicate whether the length of the run, "runlength", can be described in four bits.

That is, if runlength is less than or equal to sixteen, bit I 230 indicates that the runlength is encoded in the low four bits 235–238 of the header 210. If the runlength is longer than sixteen, then bit I 230 indicates the runlength is encoded in the variable-length stream 250, and the low order two bits 237–238 of header 210 are encoded as a byte-length indicator, indicating how many bytes are required in the stream 250 to represent the runlength. In accordance with one embodiment of the invention, a "00" in low two bits 237–238 indicates that data occupies a single byte, a "01" indicates that the runlength is encoded in two bytes, "10" indicates that the runlength is encoded in three bytes, and "11" indicates that the runlength is encoded in four bytes.

Other embodiments of the invention may use a fixed-length header of longer than eight bits. In such a case, the runlength could be described in the header in more than four bits, and thus the maximum runlength that can be encoded in the header will vary. Further, other embodiments of the invention may use more or less than four bytes to represent runlength in the stream 250 and thus would use different codes in the byte-length indicator, which can also vary in size in different embodiments, to indicate how many bytes are required to represent runlength.

Variable-length stream 250 is comprised of up to three descriptors: an intervening runlength descriptor 260, a primitive runlength descriptor 270, and a jump (or delta (Δ)) descriptor 280. Intervening runlength descriptor 260 describes the length of an intervening run of zeros and is present only if Z bit 220 in header byte 210 indicates that an intervening run of zeros is present. Intervening runlength descriptor 260 can be up to four bytes in one embodiment of the invention. The first byte 261 of zero runlength descriptor 260 dedicates its low two bits 261.1 as a byte-length indicator, indicating how many bytes are required to represent the zero runlength of the run of intervening zeros. A "00" in low two bits 261.1 indicates that only one byte, byte 261, is required to describe the zero runlength of the run of intervening zeros. A "01" in low two bits 261.1 indicates that a first byte 261 and a second byte 262 are required to describe the zero runlength of the run of intervening zeros. If the low two bits 261.1 are "10," three bytes 261–263 are required to describe the runlength of the intervening zero run. And if the low two bits 261.1 have a value of "11," four bytes 261–264 are required to describe the runlength of the run of intervening zeros. Thus, 1 byte is required to represent a zero runlength of up to 64, 2 bytes are required to describe a zero runlength of up to 16,384, 3 bytes are required to describe a zero runlength of up to 4,194,304, and four bytes describe a run of zeros having a zero runlength greater than 4,194,304.

Runlength descriptor 270 in stream 250 is present only if I bit 230 in header byte 210 indicates that the runlength of the non-zero run cannot be described in the header byte. Runlength descriptor 270 can use up to four bytes 271–274 in the present embodiment to describe the runlength of a run. The number of bytes 271–274 required to describe runlength is indicated in the low two bits 237–238 of header byte 210, as described above. If a "00" is indicated in bits 237–238, the runlength is not more than 256 and only 1 byte 271 is required. A "01" in bits 237–238 indicates two bytes 271 and 272 are required and a runlength of up to 65,536 is described. A "10" in bits 237–238 indicates three bytes 271–273 are required and a runlength of up to 16,777,216 is described. A "11" in bits 237–238 indicates four bytes 271–274 are required and a runlength of more than 16,777,216 is described in runlength descriptor 270.

jump descriptor 280 is present in stream 250 only if E bit 215 in header byte 210 indicates that the run is a run of integers, and F bit 225 in header byte 210 indicates that the run terminator is a jump value. Jump descriptor 280 describes the jump value terminator of the run as a difference between the destination cluster (e.g., 103) and the cluster holding the jump value (e.g., 71). In other words, jump descriptor 280 describes the length of the jump, "jumplength," being made and does so by encoding a difference, or a Δ, value (e.g., 32). Such a Δ value will tend to be smaller than the actual pointer value entered in the FAT (especially when describing large cluster numbers), and will thus take up less space, in the compressed data stream. (In addition, zero runlength and primitive runlength are also Δ values, indicating only the length of the runs and not specific cluster numbers).

Similar to intervening runlength descriptor 260, jump descriptor 280 can use up to four bytes in one embodiment of the invention to describe jumplength. The first byte 281 of jump descriptor 280 dedicates its low two bits 281.1 as a byte-length indicator, indicating how many bytes are required to represent the Δ value. A "00" in low two bits 281.1 indicates that only one byte, byte 281, is required to describe the length of the Δ value. A "01" in low two bits 281.1 indicates that a first byte 281 and a second byte 282 are required to describe the Δ value. If the low two bits 281.1 are "10," three bytes 281–283 are required to describe the Δ value. And if low two bits 281.1 have a value of "11", four bytes 281–284 are required to describe the Δ value. Thus, one byte is required to represent a Δ value of up to 64, two bytes are required to describe a Δ value of up to 16,384, three bytes are required to describe a Δ value of up to 4,194,304, and four bytes describe a Δ value greater than 4,194,304.

As shown in FIG. 2, descriptors 260, 270 and 280 in stream 250 are indicated with a dashed line. The dashed line is used to illustrate that each of these descriptors may or may not be present for each run code sequence. The presence of descriptors 260, 270 and 280 depends upon the characteristics of each rune,e.g.,the presence of intervening zeros, a runlength greater than a maximum-header-runlength, the presence of a jump value, etc. Further, the details of each descriptor are shown with a solid line surrounding the first byte and a dashed line surrounding each of the second through fourth bytes. Again, the solid and dashed lines indicate that if the descriptor is present, a first byte will always be present, but the remaining three bytes may or may not be present, depending upon the value being represented. Thus, the length of stream 250 varies from code sequence to code sequence.

Referring again to FIG. 1, at the start of operations, CPU 110 loads the input buffer 160 with the values from FAT 180 in a sequential order by cluster. (It is to be understood that the program instructions 155 direct the CPU 110 to load memory unit 120 with the FAT values and that they further direct the CPU 110 to rearrange and manipulate data within memory unit 120 in accordance with the following description.) In addition, FIG. 1 shows compressor 170 with dashed lines. It is to be further understood that compressor 170 is shown for illustrative purposes only, and that the functions carried out by compressor 170 are contained in program instructions 155 which are carried out by CPU 110, in one embodiment of the invention.

Figure 4:
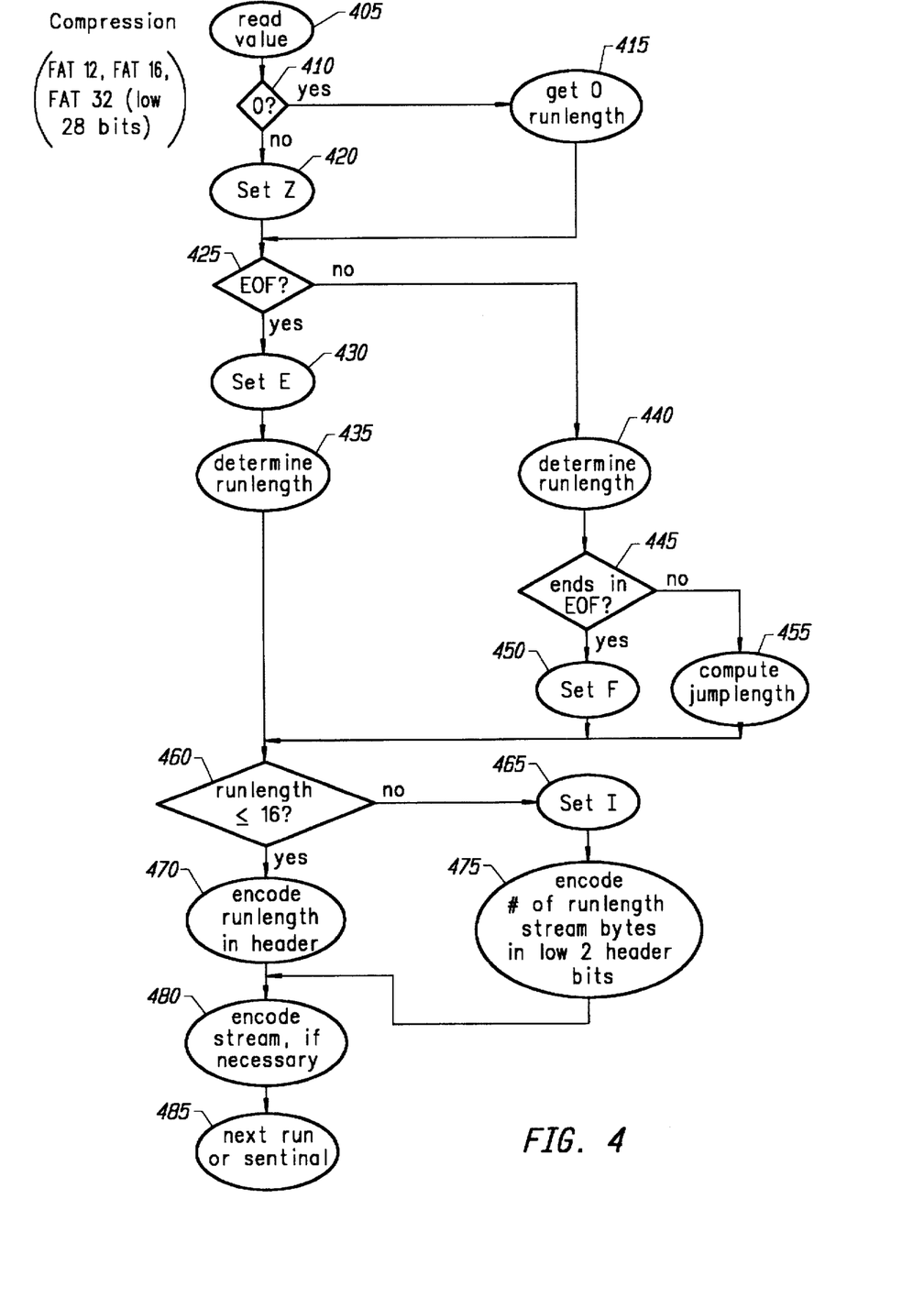
FIG. 4 is a flow diagram of steps used in compressing a 12-bit FAT, a 16-bit FAT, or the low twenty-eight bits of a 32-bit FAT in accordance with the present invention.

FIG. 4 shows the steps carried out by CPU 110 used by compressor 170 to manipulate the data in input buffer 160 to achieve compressed data in output buffer 190. In step 405, a first value is read from input buffer 160. In step 410, it is determined whether or not this value is an intervening code, a zero in the present embodiment. If the value is a zero, then it is determined, in step 415, how many consecutive zeros there are; in other words, the zero runlength is determined, generally by counting methods known to those of skill in the art. If, alternatively, at step 410 the value read is not a zero, bit Z 220 in header byte 210 (FIG. 2) is set (made a "1" in one embodiment of the invention) in step 420 to indicate no zeros (intervening codes) are present.

After determining the presence of a run of zeros and the length of such a rune if any, steps 410–420, a next value is read from the input buffer 160, and it is determined whether or not that value is an EOF, step 425. If the value is an EOF, bit E 215 of header byte 210 (FIG. 2) is set in step 430 to indicate that the type of run is a run of EOFs. The runlength of EOFs is then determined, generally by counting methods known to those of skill in the art, in step 435.

If, in step 425, the value is not an EOF, the the of run is a run of integers, and in step 440, the runlength of the run of integers is determined by counting methods known to those of skill in the art. In step 445, it is determined whether the run of integers terminates in an EOF or a jump value. If the run terminator is an EOF, F bit 225 in header byte 210 (FIG. 2) is set to so indicate in step 450. If, in step 445, it is determined that the run terminator is a jump value, the difference between the destination cluster and the current cluster is calculated (i.e., the "jumplength," a Δ value, is computed) in step 455.

After the performance of one of steps 435, 450 or 455, the procedure moves to step 460, where it is determined if the runlength can be encoded in the header byte. In one embodiment of the invention, the runlength must be less than or equal to sixteen to be encoded in the header byte. Thus in step 460 if the runlength is less than or equal to sixteen, the runlength is encoded in the low four bits 235–238 of header 210. If at step 460 the runlength is greater than sixteen, the I bit 230 of header byte 210 (FIG. 2) is set to so indicate, step 465, and the number of bytes which would be required in the stream to encode the runlength in runlength descriptor 270 are encoded in the low two header bits 237–238, step 475.

After performing either step 470 or 475, the procedure continues at step 480. At step 480, if Z is not set, then the zero runlength, determined at step 415, is encoded in zero runlength descriptor 260. If the I bit 230 of header byte 210 is set, then the runlength determined at step 435 or 440 is encoded in runlength descriptor 270. If the F bit 225 in header byte 210 is not set, then the jumplength computed at step 455, is encoded in jump descriptor 280.

Following step 480, the procedure at step 485 returns to step 405 and the next value following the run just encoded is read and the procedure repeats.

When all values in input buffer 160 have been read, then a unique header byte, a sentinal, is encoded. The sentinal sets both the E bit 215 and the F bit 225 of header byte 210 to "1" values in one embodiment of the invention. In the context of FAT runs of non-zero primitives, having both E and F set is not meaningful because F (an integer run terminator indicator) can only be set when the E bit (a primitive-type indicator which is set in the present embodiment when the run is a run of EOFs) is not set. Thus, having both E and F set indicates in a code sequence that the end of the FAT has been reached.

For the example FAT 180 shown in FIG. 1, there are three primitive runs and two runs of intervening zeros. The resulting compressed data is shown in abbreviated form in output buffer 190. The first primitive run, Run 1, is a run of EOFs, and is represented with code sequence 191, having header byte 191.1 and a stream consisting of an intervening length descriptor 191.2. The second primitive run, Run 2, is represented with a code sequence 192 comprising a header byte only. The third data run, Run 3, is shown in output buffer 190 as a code sequence 193 comprising a header byte 193.1, an intervening runlength descriptor 193.2, a primitive runlength descriptor 193.3, and a jumplength descriptor 193.4. Further, code sequences representing compressed primitive runs continue until the end of the FAT is reached, and sentinal 195 is encoded. Table 2 below shows the actual bit code sequences which are represented in abbreviated form in output buffer 190.

TABLE 2

|  | header byte | stream |  |  |
| --- | --- | --- | --- | --- |
| Run 1 | 10000010 | 00101000 |  |  |
| Run 2 | 01101111 |  |  |  |
| Run 3 | 00010000 | 01010100 | 00010101 | 10000000 |
| Sentinal | 1x1xxxxx |  |  |  |

The above-described method in accordance with the invention and described with reference to FIGS. 1, 2 and 4, is generally useful for compressing 12-bit FATs, 16-bit FATs, and the low order twenty-eight bits of a 32-bit FAT. The low twenty-eight bits of the 32-bit FAT represent and contain similar data as that in 12-bit FATs and 16-bit FATs. The upper four bits of a 32-bit FAT, however, are reserved for purposes that have not been determined (by Microsoft Inc.) at the time of this writing. Thus, to take these bits into account and in accordance with the invention, the upper four bits of a 32-bit FAT are handled separately from the lower twenty-eight bits.

Figure 3:
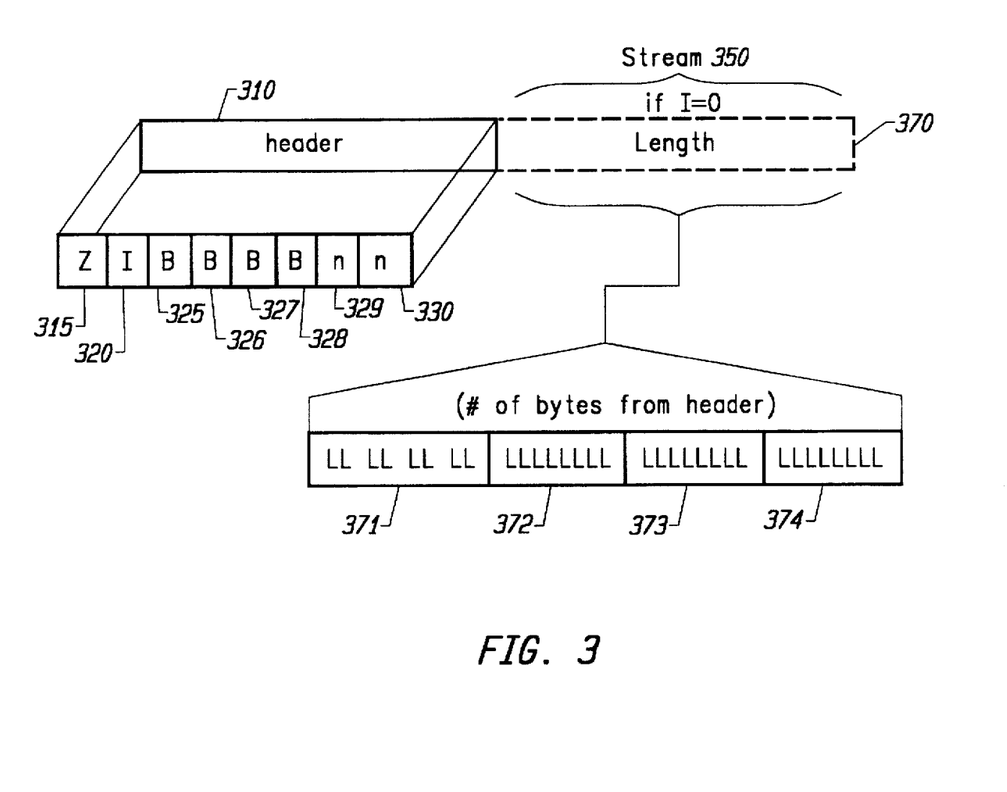
FIG. 3 is a block diagram representing the general compressed data structure of the upper four bits of a 32-bit FAT in accordance with the invention.

FIG. 3 shows a diagram of the general compressed data structure of the upper four bits of a 32-bit FAT. The upper four bits of a 32-bit FAT are represented in a code sequence 300 having a fixed-length header 310 and a variable-length stream 350. The fixed-length header 310, in one embodiment of the invention, is comprised of 8 bits (1 byte). The fixed-length header indicates whether the present run being compressed is a run of zeros or a bit pattern, and whether the length of the run of zeros and/or the bit pattern is described in the header. Table 3 below summarizes the bits used in header 310. Other embodiments of the invention may reverse various "1" and "0" indications and may further utilize a differing number of bits in fixed-length header to indicate similar information.

TABLE 3

| Z | 1 if run of zeros |
| --- | --- |
|  | 0 if run of bits |
| I | 1 if runlength is included in stream |
|  | 0 if runlength is included in header |
| BBBB | if Z=0, BBBB = bit pattern |
|  | if Z=1 and I=0, BBBB is combined with nn to describe the runlength in header. |
|  | Otherwise, bits are ignored |
| nn | if I=1, nn = 00 if runlength can be represented in 1 stream byte |
|  | = 01 if runlength can be represented in 2 stream bytes |
|  | = 10 it runlength can be represented in 3 stream bytes |
|  | = 11 it runlength can be represented in 4 stream bytes |
|  | if I=0, nn indicates runlength |

The highest bit in header 310 is the Z bit 315, which indicates whether the current run is a run of zeros. If the Z bit is not set, then the run describes a pattern of bits, and the actual bit pattern is encoded in bits BBBB 325–328. In compressing the upper four bits of a 32-bit FAT, zeros are identified as primitive values as are 4-bit bit patterns, but no codes are identified as intervening codes in the current embodiment.

Bit I 320 indicates whether the length of the run of zeros, or the length of the bit pattern run is included in the header. If the run is a run of zeros, then the six low order bits 325–330 can each be used to describe the length of the run. However, if the run is a run of bits, then only the two low order bits 329–330 are used to describe the length of the run (the middle four bits 325–329 describe the bit pattern). If the length cannot be included in the header, then the low two bits 329–330 indicate how many bytes are required to represent the length in a length of run descriptor 370 located in stream 350.

Stream 350 includes a runlength descriptor 370 which is comprised of up to four bytes, depending on the length of the run. The number of bytes present in runlength descriptor 370 is indicated in the header byte 310 by low order bits 329 and 330, as described above. If a "00" is indicated in bits 329–330, the length of the run is not more than 256 and only one byte 371 is required. A "01" in bits 329–330 indicates two bytes 371–372 are required and a length of up to 65,536 is described. A "10" in bits 329–330 indicates three bytes 371–373 are required and a length of up to 16,777,216 is described. A "11" in bits 329–330 indicates four bytes 371–374 are required and a length of more than 16,777,216 is described.

The dashed lines surrounding runlength descriptor 370 indicate that runlength descriptor 370 may or may not be present in each run code sequence. Runlength descriptor 370 is only present if I bit 320 in header byte 310 is not set. In addition, dashed lines surrounding bytes 372–374 in runlength descriptor 370 indicate that if runlength descriptor 370 is present, its length will vary between one byte and four bytes.

In order to compress a 32-bit FAT, two passes through the FAT data loaded into input buffer 160 are required. The first pass reads the low 28 bits of each FAT entry value. The second pass reads the upper four bits of each FAT entry value. In one embodiment of the invention, all thirty-two bits of each FAT entry value are loaded into input buffer 160 simultaneously, and, in reading buffer 160, four bits, the upper bits, are skipped after reading twenty-eight bits. A second pass through buffer 160 reads the skipped four bits and skips the already read twenty-eight bits. In another embodiment of the invention, only the low twenty-eight bits from the FAT values are loaded into the input buffer 160. A "first pass" is completed when these bits are read and compressed. Then the upper four bits of the 32-bit FAT values are loaded into the buffer for the "second pass."

Figure 5:
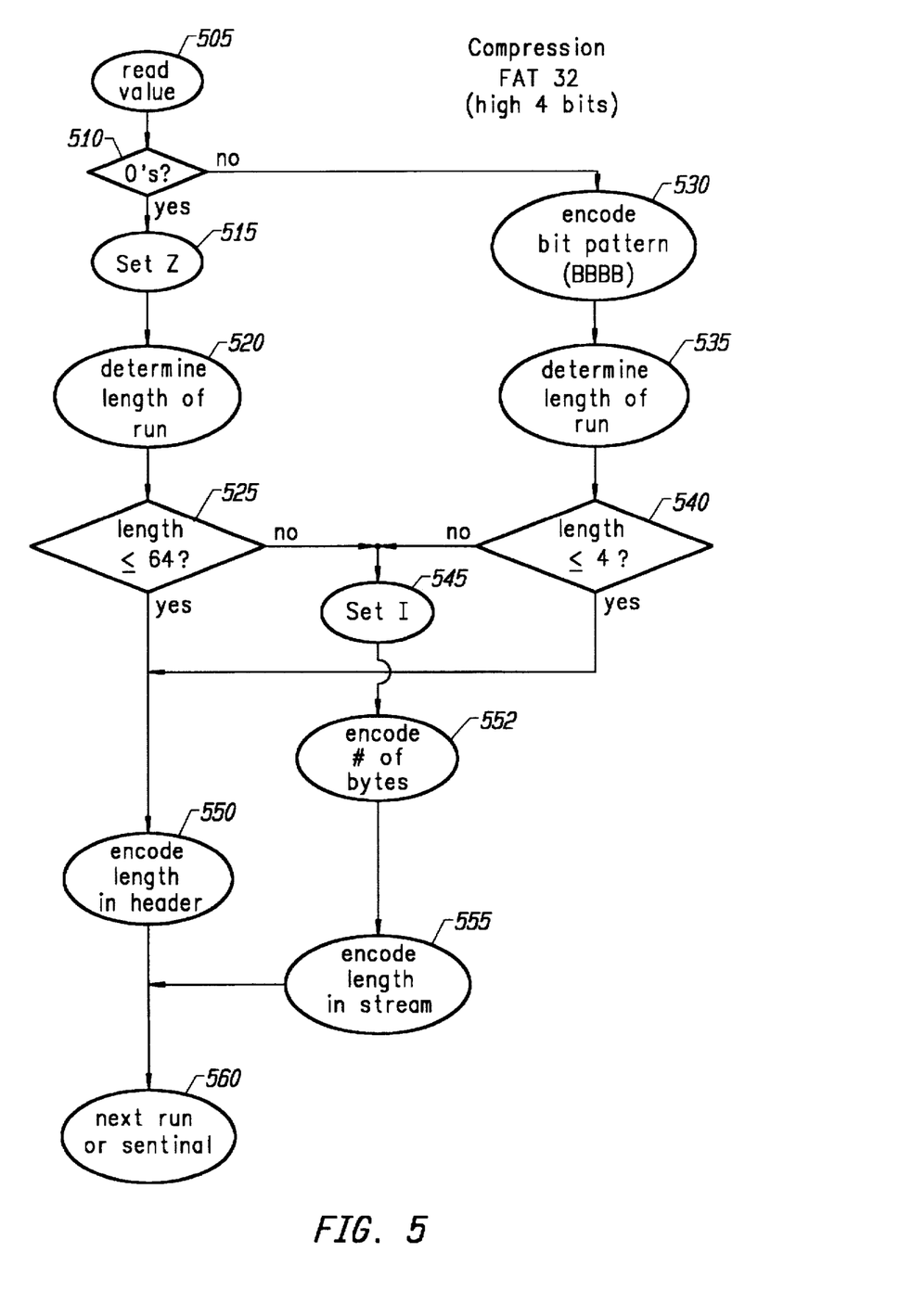
FIG. 5 is a flow diagram representing the steps used to compress the upper 4 bits of a 32-bit FAT in accordance with the present invention.

With reference to FIG. 5, the steps in accordance with one embodiment of the invention for compressing the high four bits of a 32-bit FAT are described. In step 505 a first bit value from buffer 160 is read, and in step 510 it is determined whether or not this value is a zero. If the value is zero, then in step 515 Z bit 315 (FIG. 3) is set and the runlength of the run is determined in step 520. If the runlength of the run is less than 64, the maximum number that can be encoded in the low order six bits of header 310 in the presently described embodiment, then the runlength is encoded in the low six bits of the header 310 in step 550. If at step 510, the value read was not a zero, then that bit plus the next three bits are encoded as a bit pattern in bits BBBB 325–328 of header 310 in step 530. The number of times this bit pattern repeats is determined as the runlength of the run in step 535. If in step 540 the runlength of the run is less than or equal to four, then I bit 320 is set in step 545, and the runlength of the run is encoded, in step 350, in the low two bits 329–330 of the header 310.

If in either step 525 or step 540 the runlength of the run is greater than the maximum number (either 64 or 4) that can be encoded in the header, then the I bit 320 is set in step 545 and the process proceeds to step 552 where the number of bytes required to represent the runlength of the run are encoded in the low two bits of header byte 310. The runlength of the run is then encoded in length descriptor 370 in stream 350, step 355.

Following either step 550 or 555, the process proceeds to step 560. In step 560, the process returns to step 505 and reads the next run. The arrival at the end of the FAT is indicated with a unique header byte, a sentinal byte, which is different from that described with respect to the compression of 12-bit FATs, 16-bit FATs and the low twenty-eight bits of 32-bit FATs. The sentinal for the compressed upper four bits of 32-bit FAT values is represented with a header byte 310 composed of all zeros. Again, such a header byte would not be meaningful in the context of compressed FAT runs if done in accordance with the method described with reference to FIGS. 3 and 5.

Using the process steps described with reference to FIGS. 1–5, a typical FAT in a DOS-type system can be compressed at a ratio of approximately 4533:1 (e.g., a 1 Gig FAT can be compressed to approximately 59 Kb).

Figure 6:
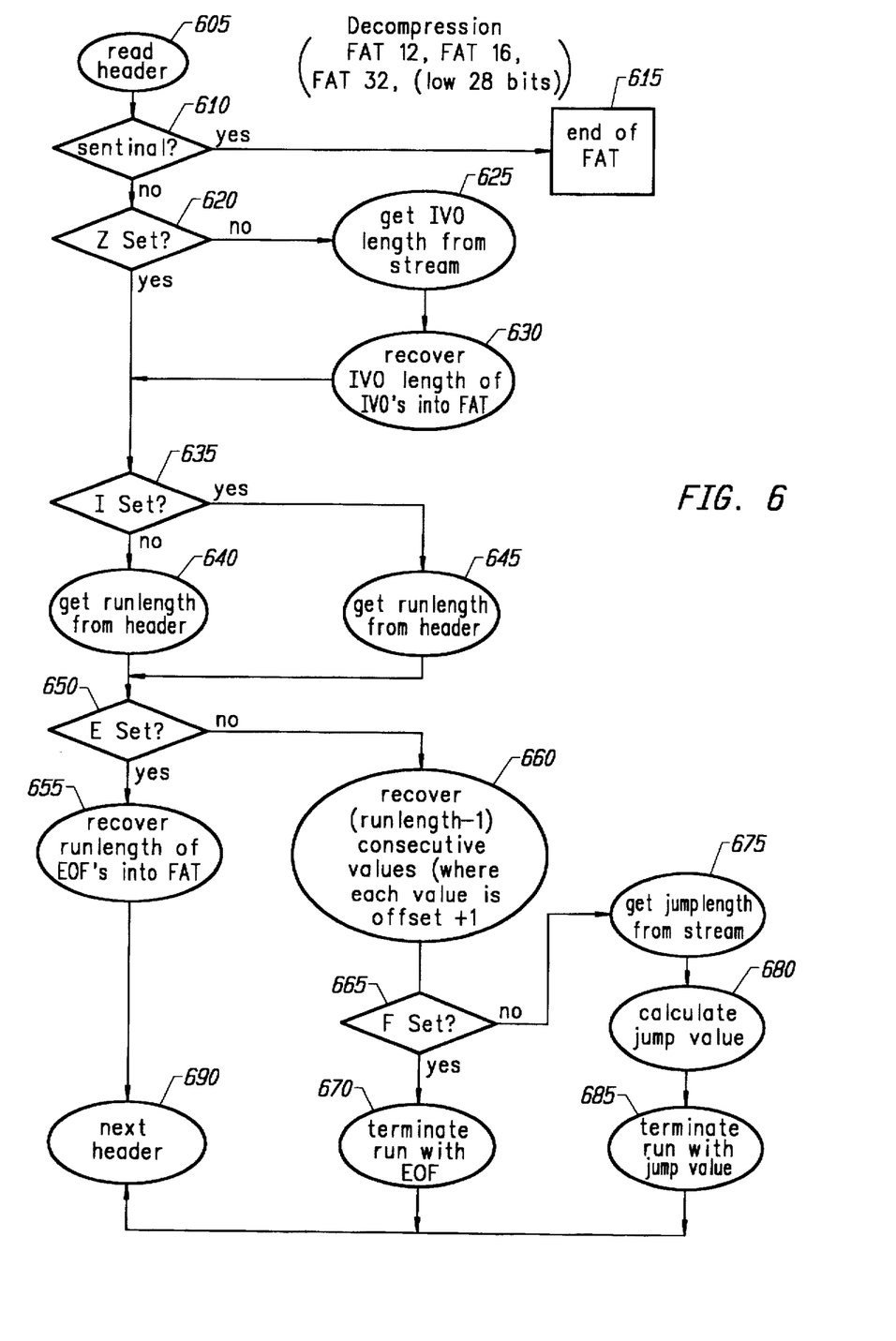
FIG. 6 is a flow diagram representing decompression of compressed data generated from a 12-bit FAT, a 16-bit FAT, or the low 28 bits of a 32-bit FAT in accordance with the present invention.

Decompression of a 12-bit FAT, a 16-bit FAT, or the low twenty-eight bits of a 32-bit FAT compressed in accordance with a method of the present invention is described with reference to FIG. 6. In step 605, a header byte is read into an input buffer in memory 120. The input buffer for decompression of a FAT may ben in different embodiments, the same or different from input buffer 160 in FIG. 1. In step 610, if the header indicates a sentinal value, e.g., both the E bit 215 and the F bit 225 are set, then the end of the FAT has been reached, step 615.

If, in step 610 it is determined that it is not the sentinal, then it is next determined whether or not Z bit 220 has been set, which would indicate the presence of an intervening run of zeros. If the Z bit has not been set, then the process proceeds to step 625, where the intervening runlength descriptor 260 is read from the stream. The number of bytes to obtain from the stream for intervening runlength descriptor 260 is indicated in the low two bits 261.1 of the first byte 261 in the descriptor 260. In step 630, the number of zeros indicated in the intervening runlength descriptor 260 are recovered into consecutive FAT cluster entries in an output buffer holding the recovered FAT data, where the output buffer may, in different embodiments, be the same or different from output buffer 190 shown in FIG. 1.

After determining the presence of and replacing zeros in the FAT at steps 620–630, it is determined in step 635 whether or not I bit 230 in header byte 210 is set. If it is not set, the runlength value is obtained from the low order bits 235–238 of header byte 210 in step 640. If the I bit is set, then in step 645, the runlength is retrieved from the runlength descriptor 270 in stream 250. The number of runlength bytes to be retrieved is indicated in the low two bits 237–238 of the header byte 210.

Once the runlength has been retrieved in steps 635–645, it is determined whether or not the E bit is set in step 650. If the E bit is set, then the run to be recovered is a run of EOFs. In step 655, the runlength number of EOFs are recovered into the next available consecutive FAT cluster entries.

If the E bit in step 650 was non set, then the run to be recovered is a run of consecutive integers. In step 660, a (runlength–1) number of consecutive increasing integers are recovered into the next available FAT cluster entries, where each entry value is the (current cluster number+1), thus indicating consecutive clusters.

After the run of consecutive integers is recovered with the exception of the last value in the run, it is determined in step 655 whether F bit 225 in header byte 210 has been set. If it has been set the run terminates with an EOF, and the EOF is recovered into the FAT to terminate the run. If, however, it is determined that step 665 does not end in an EOF, then the jumplength must be recovered from jump descriptor 280 in stream 250, step 675. The number of bytes to be recovered for jump descriptor 280 is indicated in the low two bits 281.1 of the first byte 281 of the jump descriptor 280. From the recovered jumplength (a Δ value), the jump value must be calculated by adding the jump value to the current cluster location in step 680. Once calculated, the jump value is recovered into the FAT to terminate the run, step 685.

Following one of steps 655, 670, or 685, the process proceeds to step 690. In step 690, the process returns to step 605 to repeat these steps for the next code sequence 200.

Figure 7:
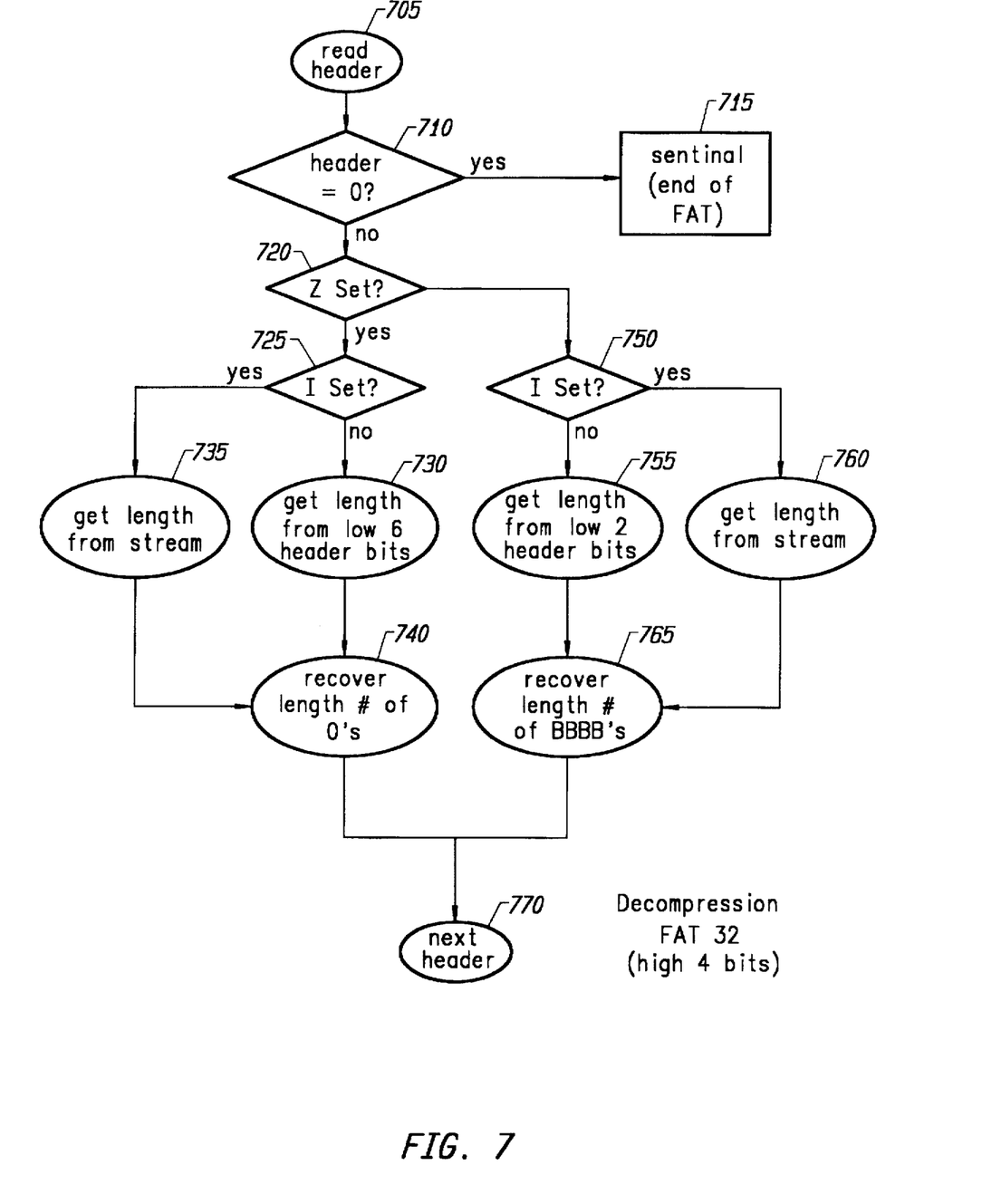
FIG. 7 is a flow diagram representing the steps of decompressing the compressed data from the high four bits of a 32-bit FAT in accordance with the present invention.

In FIG. 7, the steps for decompressing the high four bits of a 32-bit FAT are described. In step 705 a first header is read. In step 710 it is determined whether or not the header is comprised of all zeros. If the header is comprised of all zeros, then a sentinal is present, indicating the end of the FAT in step 715 and the process terminates.

However, if at step 710, the header is not all zeros, then, in step 720, it is determined whether or not the Z bit 315 is set. If the Z bit is set, then the run is a run of zeros. In step 725, it is determined if the I bit 320 is set. If the I bit is not set, then the runlength of the run is indicated in the header byte 310. The runlength is obtained in step 730 from the low six header bits, and the runlength number of zeros is recovered into the FAT in the next available upper 4-bit locations, step 740. If, however, at step 725, it is determined that the I bit is set, then at step 735 the runlength of the run is retrieved from the runlength descriptor 370 in stream 350. The number of bytes to recover for runlength descriptor 370 are indicated in the low two bits 329–330 of header byte 310. A runlength number of zeros is then recovered into the FAT at step 740.

If at step 720, it is determined that the Z bit is not set, then a bit pattern is described. At step 750, it is determined if the I bit 320 is set. If the I bit 320 is not set, then the runlength of the run of the bit pattern is retrieved from the low two header bits 329–330 in step 755. Then, in step 765, the runlength number of the pattern BBBB (bits 325–328) is recovered into the FAT. However, if at step 750 it is determined that the I bit is set, then the runlength of the run for the bit pattern is retrieved from the runlength descriptor 370 in stream 350. In step 765 the length number of the bit pattern BBBB is then recovered into the FAT.

Following either of steps 740 or 765, the process continues to step 770. At step 770, the next header is then read and the process repeats from step 705.

Those skilled in the art will recognize that many variations are possible for the data processing scheme described above. For instance, it should be clear that a method and apparatus in accordance with the invention can be used to compress any type of run-intensive data structure including runs of primitives of any type (not just EOFs and +1 jumps).

In addition, the principles illustrated with the above description and computer program listing can be applied to operating systems other than DOS and Windows'95™. For instance, in Macintosh™ and Windows NT™ operating systems, the directory list of DOS systems is replaced with an extent list, which stores a file ID, and an extent for each file. An extent generally comprises a starting cluster number and also indicates the number of contiguous clusters (i.e., the length of a run) used. For instance, if a file X is in 3 pieces, one piece starting with cluster a, a second piece starting with cluster b, and a third piece starting with cluster c, then the extent list for file X includes an identification of cluster a, the number of contiguous clusters used by the file starting with cluster a, and a pointer (i.e., a jump value terminator) to cluster b. The extent list for file X further includes an identification of cluster b, the number of contiguous clusters starting with cluster b, and a pointer to cluster c, as well as an identification of cluster c and the number of contiguous clusters starting with cluster c.

In these other operating systems; instead of using a FAT like those described above for DOS-type systems, a "bit-FAT" is used. A bitFAT indicates only which clusters are used and which clusters are unused (e.g., with a "1" indicating "used" or a "0" indicating "unused") rather than pointing to and forming a linked list of clusters as with the DOS-type FAT. The combination of a directory extent list and a bitFAT is known as a "distributed FAT."

While the extent listing can be equivocated to a description of lengths of runs, the fact remains that even using extent lists, these operating systems store each extent as a fixed size (e.g., 32 bits), regardless of the number of bits it actually takes to represent such numbers. Therefore, such a distributed FAT methodology could benefit from a compression method in accordance with the invention. For instance, the use of deltas for encoding jump value pointers and/or the use of a variable-length stream, for indicating the lengths of runs would serve to be beneficial in storage of distributed FATs.

Given the above disclosure of general concepts and specific embodiments, the scope of protection sought is to be defined only by the claims that follow.

What is claimed is:

1. A machine-implemented data compression method, comprising the steps of:

receiving an input data string in a memory, said input data string including a plurality of primitive runs; and generating within said memory an output data string including a plurality of code sequences, wherein each code sequence includes a header portion and a stream portion, said header portion having a length equal in length to the header portion of each code sequence and said stream portion having a length which varies in length with respect to the length of the stream portion of other code sequences in said plurality of code sequences, said stream portion having a length ≧0, where each code sequence is dedicated to a primitive run and indicates of its dedicated primitive run a primitive type and a primitive runlength.

2. The machine implemented method of claim 1, wherein:

said step of receiving an input data string includes receiving said input data string having at least one of said primitive runs including a jump value pointer; and said step of generating an output data string includes generating one of said plurality of code sequences dedicated to said at least one of said primitive runs which further indicates a jumplength relating to said jump value pointer.

3. The machine implemented method of claim 2, wherein said at least one of said primitive runs terminates in said jump value pointer.

4. The machine-implemented method of claim 1, wherein:

said step of receiving an input data string includes receiving said input data string which further includes a plurality of intervening runs; and said step of generating an output data string includes generating said plurality of code sequences to indicate an intervening runlength.

5. The machine-implemented method of claim 1, wherein:

said step of generating an output data string including a plurality of code sequences includes generating, in said header portion; a primitive type indicator and a runlength-included-in-header indicator, and in said stream portion; a primitive runlength descriptor for describing said primitive runlength.

6. The machine implemented method of claim 1, wherein:

said step of receiving an input data string includes receiving a distributed FAT extent list, wherein each of said primitive runs in said plurality of primitive runs is pre-encoded with its respective runlength, and wherein some of said plurality of primitive runs also include a jump value pointer; and said step of generating said output data string includes generating said plurality of code sequences to further indicate a jumplength related to said jump value pointer.

7. A machine-implemented data compression method, comprising the steps of:

receiving, in a memory, a plurality of primitive runs and intervening runs;

generating, within said memory, a plurality of code sequences, where each code sequence includes a header portion and a stream portion, said header portion having a length equal in length to the header portion of each code sequence and said stream portion having a length which varies in length with respect to the length of the stream portion of other code sequences in said plurality of code sequences, said stream portion having a length $\geq 0$, where each code sequence is dedicated to a primitive run and indicates of its dedicated primitive run a primitive type, a primitive runlength, and a jumplength for a jump value pointer, and further indicates an intervening runlength.

8. The machine-implemented method of claim 7, wherein said primitive runlength, said intervening runlength, and said jumplength are each encoded in said code sequence as delta values.

9. The machine-implemented method of claim 7, wherein said step of generating a plurality of code sequences includes generating a code sequence wherein said intervening runlength is zero, indicating the absence of an intervening run, and wherein said jumplength is zero, indicating the absence of a jump value pointer.

10. The machine-implemented method of claim 7, wherein said step of generating a plurality of code sequences includes generating, in said header portion, a primitive type indicator, an intervening run indicators a jump value pointer indicator, and a runlength-included-in-header indicator, and in said stream portion, an intervening runlength descriptor for describing said zero runlength, a primitive runlength descriptor for describing said primitive runlength, and a jumplength descriptor for describing said jumplength.

11. The machine-implemented method of claim 7, wherein the step of generating a plurality of code sequences includes the steps of:

generating one code sequence dedicated to a primitive run having a jump value pointer and wherein said jump value pointer indicates a jump from a current location to a destination location;

calculating the jumplength for the jump value pointer by calculating the difference between the destination location and the current location;

encoding the jumplength in said one code sequence.

12. The machine-implemented method of claim 11, wherein said step of encoding said jumplength in said one code sequence includes:

encoding said jumplength in a jump descriptor in said stream portion; and encoding a jump descriptor byte-length indicator in said jump descriptor.

13. The machine-implemented method of claim 7, wherein the step of generating a plurality of code sequences further includes, for each primitive run, the steps determining said primitive runlength;

encoding said primitive runlength in the code sequence dedicated to the primitive run.

14. The machine-implemented method of claim 13, wherein the step of encoding said primitive runlength further includes the steps of:

determining that said primitive runlength is at most a maximum-header-runlength;

encoding said primitive runlength in said header portion;

encoding a runlength-included indicator in said header portion.

15. The machine-implemented method of claim 13, wherein the step of encoding said primitive runlength further includes the steps of:

determining that said primitive runlength is greater than a maximum-header-primitive runlength;

encoding said primitive runlength in a primitive runlength descriptor in said stream portion;

encoding a runlength-included indicator in said header portion;

encoding a primitive-runlength-descriptor byte-length indicator in said header portion.

16. The machine-implemented method of claim 7, wherein the step of generating a plurality of code sequences further includes, for each primitive run, the steps of:

determining said intervening runlength for an intervening run;

encoding said intervening runlength in an intervening length descriptor in said stream portion;

encoding an intervening-length-descriptor byte-length indicator in said intervening length descriptor; and encoding an intervening run indicator in said header portion.

17. The machine-implemented method of claim 7, wherein said step of receiving a plurality of intervening runs and primitive runs includes receiving the low 28 bits of the entries in a 32-bit FAT.

18. The machine-implemented method of claim 16, further comprising the steps of:

receiving the upper four bits of the entries in a 32-bit FAT, which include a second plurality of primitive runs;

generating within memory a second plurality of code sequences, where each code sequence in said second plurality of code sequences varies in length with respect to other code sequences in said second plurality of code sequences, where each code sequence in said second plurality of code sequences is dedicated to a primitive run in said second plurality of runs and indicates a primitive type and a primitive runlength.

19. The machine-implemented method of claim 18, wherein the step of generating a second plurality of code sequences includes generating for each code sequence a second header portion and a second stream portion.

20. The machine-implemented method of claim 18, wherein:

said step of receiving the upper four bits of the entries in a 32-bit FAT includes receiving a second plurality runs, including runs of a first primitive and runs of a second primitive, wherein said first primitive is a null-indicator and wherein said second primitive is a multi-bit bit pattern.

21. A computer readable medium having a set of instructions stored therein, which when executed by a processing unit of a computer, causes the computer to perform the steps of:

receiving an input data string in a memory, said input data string comprised of a plurality of primitive runs; and generating within said memory an output data string comprised of a plurality of code sequences, wherein each code sequence includes a header portion and a stream portion, said header portion having a length equal to the length of the header portion of each code sequence in said plurality of codes sequences and said stream portion having a length which varies in length with respect to the length of the stream portion of other code sequences in said plurality of code sequences, said stream portion having a length $\geq 0$, where each code sequence is dedicated to a primitive run and indicates of its dedicated run a primitive type and a primitive runlength.

22. The computer readable medium of claim 21, wherein:

the instructions for performing the step of receiving an input data string include instructions of receiving said input data string having at least one of said primitive runs including a jump value pointer; and the instructions for performing the step of generating an output data string include instructions for generating one of said plurality of code sequences dedicated to said at least one of said primitive runs which further indicates a jumplength relating to said jump value pointer.

23. The computer readable medium of claim 22, wherein said at least one of said primitive runs terminates in said jump value pointer.

24. The computer readable medium of claim 21, wherein:

the instructions for performing the step of receiving an input data string include instructions for receiving said input data string which further includes a plurality of intervening runs; and the instructions for performing the step of generating an output data string includes instructions for generating said plurality of code sequences to indicate an intervening runlength.

25. The computer readable medium of claim 21, wherein the instructions for performing said step of generating an output data string including a plurality of code sequences includes instructions for generating, in said header portion, a primitive type indicator, and a runlength-included-in-header indicator, and in said stream portion, a primitive runlength descriptor for describing said primitive runlength.

26. A data processing system, comprising:

input means for storing a plurality of primitive runs and intervening runs;

output means for storing a plurality of code sequences;

code sequence generating means, operatively coupled to said input means and said output means, for generating said plurality of code sequences, where each code sequence has a header portion and a stream portion, said header portion having a length equal to the length of the header portion of each code sequence in said plurality of codes sequences and said stream portion having a length which varies in length with respect to the length of the stream portion of other code sequences in said plurality of code sequences, said stream portion having a length $\geq 0$, and where each code sequence is dedicated to a primitive run and indicates of its dedicated primitive run a primitive-type, a primitive runlength, and a jumplength for a jump value pointer, and further indicates an intervening runlength.

27. The data processing system of claim 26 wherein:

said code sequence generating means includes a processing unit; and memory means operatively coupled to said processing unit, wherein said input means and said output means are included in said memory means.

28. The data processing system of claim 27 wherein:

said code sequence generating means further includes program instructions stored in said memory means, wherein said program instructions direct the processing unit to read said plurality of primitive runs and generate said plurality of code sequences.

29. The data processing system of claim 28, wherein said code sequence generating means further generates:

in said header portion, a primitive-type indicator, an intervening run indicator, a jump value pointer indicator, and a runlength-included-in-header indicator; and in said stream portion, an intervening runlength descriptor for describing said intervening runlength, a primitive runlength descriptor for describing said primitive runlength, and a jumplength descriptor for describing said jumplength.

30. The data processing system of claim 26, wherein said intervening runlength is zero, indicating the absence of an intervening run, and wherein said jumplength is zero, indicating the absence of a jump value pointer.

* * * * *

UNITED STATES PATENT AND TRADEMARK OFFICE
CERTIFICATE OF CORRECTION

PATENT NO. : 5,734,340
DATED : March 31, 1998
INVENTOR(S) : Mark Kevin Kennedy

It is certified that error appears in the above-identified patent and that said Letters Patent is hereby corrected as shown below:

Cover page, at [73], after "Assignee:" and before "Corporation", delete "Symantech" and substitute therefor --Symantec--.

Col. 14, line 53, after "portion" and before "a", delete ";" and substitute therefor --,--.

Col. 14, line 55, after "portion" and before "a", delete ";" and substitute therefore --,--.

Col. 15, line 32, after "run" and before "a", delete "indicators" and substitute therefor --indicator,--.

Col. 16, line 34, after "claim" and before ",", delete "16" and substitute therefor --17--.

Signed and Sealed this

Twenty-ninth Day of September, 1998

BRUCE LEHMAN

*Attest:*

*Attesting Officer*     *Commissioner of Patents and Trademarks*